United States Patent [19]

Sorensen et al.

[11] Patent Number: 5,142,445
[45] Date of Patent: Aug. 25, 1992

[54] MODULAR STACKABLE INTERLOCKING STORAGE CABINET FOR ELECTRONIC COMPONENTS

[76] Inventors: Bradford T. Sorensen, 201 S. Lake Ave., Suite 405, Pasadena, Calif. 91101; Bruce Rogers, 3960 Laurel Canyon Blvd., Suite 374, Studio City, Calif. 91604; Steven S. Leonard, 14744 Hepsy St., Sherman Oaks, Calif. 91403

[21] Appl. No.: 659,005

[22] Filed: Feb. 21, 1991

Related U.S. Application Data

[63] Continuation-in-part of Ser. No. 533,118, Jun. 1, 1990, abandoned.

[51] Int. Cl.⁵ .......................... H05K 7/18; B65D 6/00; B65D 21/00
[52] U.S. Cl. .................................. 361/391; 220/4.26; 220/4.34; 206/329; 206/503; 206/509; 206/816
[58] Field of Search ............... 361/380, 390, 391, 393, 361/399, 396, 415, 429; 200/307; 220/4.02, 4.26, 4.27, 4.31, 4.34; 206/328, 329, 334, 503, 509, 511, 816; 312/107, 109, 213, 223, 244, 297, 341.1; 211/26, 194

[56] References Cited

U.S. PATENT DOCUMENTS

| | | | |
|---|---|---|---|
| 3,012,762 | 12/1961 | Norns | 312/107 X |
| 3,626,251 | 12/1971 | Vigue | 361/390 |
| 3,729,242 | 4/1973 | Barney | 312/107 |
| 3,877,764 | 4/1975 | Hillier, Jr. | 312/107 |
| 4,202,586 | 5/1980 | Oplinger | 312/107 |
| 4,432,591 | 2/1984 | Rinkewich | 312/297 |
| 4,567,989 | 2/1986 | Hurst, Jr. | 211/194 X |
| 4,699,270 | 10/1987 | Bohm | 206/334 |

FOREIGN PATENT DOCUMENTS

| | | | |
|---|---|---|---|
| 3608057 | 9/1987 | Fed. Rep. of Germany | 361/415 |
| 2215310 | 9/1989 | United Kingdom | 220/4.26 |

Primary Examiner—Leo P. Picard
Assistant Examiner—Michael W. Phillips
Attorney, Agent, or Firm—Sean Patrick Suiter

[57] ABSTRACT

A modular storage cabinet for electronic components which includes at least one base having front back and opposite side walls. Each base side wall includes a coacting top and bottom fastener. A plurality of stackable side bars wherein each side bar includes an elongated wall portion having interior and exterior faces and co-acting top and bottom fasteners on each wall portion. The bottom fasteners are adapted to engage with the top fasteners of a base or side bar for stackably supporting the side bar in registered relation thereon and the top fasteners being engagable with bottom fasteners of a base or side bar for stackably supporting the last mentioned base or sidebar thereon. Any selected number of side bars may be stacked on each of opposite side walls of a base for defining the spacing between adjacent stacked bases.

12 Claims, 4 Drawing Sheets

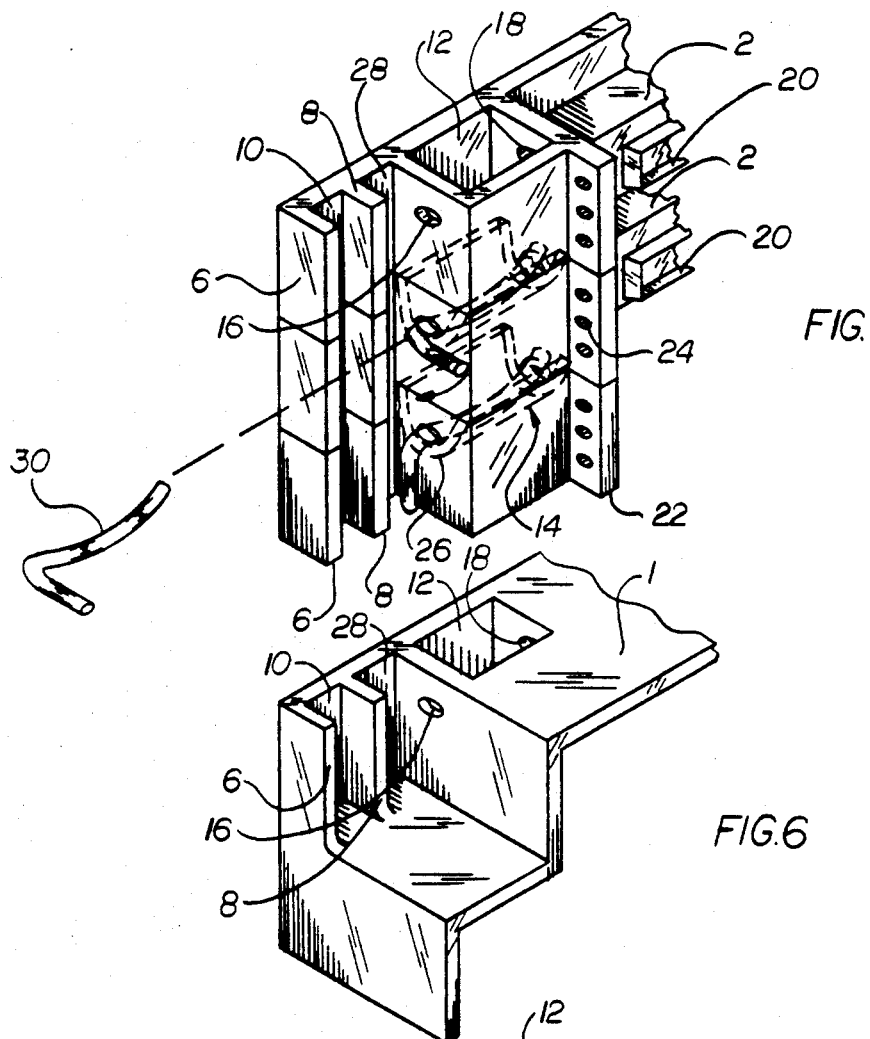
FIG. 4
FIG. 6
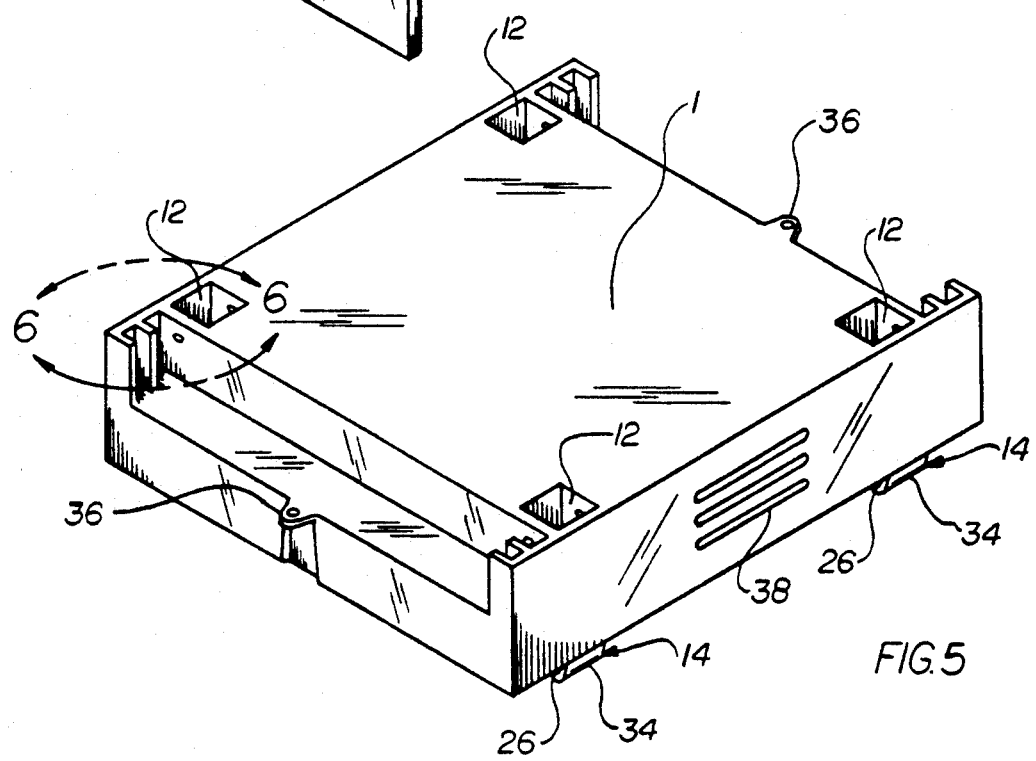
FIG. 5

MODULAR STACKABLE INTERLOCKING STORAGE CABINET FOR ELECTRONIC COMPONENTS

CROSS-REFERENCED TO RELATED APPLICATION

This is a continuation-in-part of application Ser. No. 07/533,118, filed Jun. 1, 1990, now abandoned.

BACKGROUND OF THE INVENTION

1. Technical Field

The present invention is directed to protective housings for electronic equipment and more particularly to transportable modular stackable interlocking storage cabinets which may accommodate electronic components of varying height.

2. Description of the Prior Art

Electronic components are inherently fragile and difficult to handle. Likewise, by their design individual components are often dedicated to perform a single function. For this reason it is often desirable to interconnect several different electronic components so as to best achieve a desired result.

For example, while it may often be desirable to protectively house a single multi-purpose component it is more often necessary to protectively house a plurality of such components. For instance, musicians are desirous of obtaining a durable, interchangeable cabinet type housing adapted to protectively house amplifiers, channel mixers, equalizers, and the like.

Likewise, the military requires that sonar, radar, electronic counter measure, and communication equipment be protectively housed in durable light-weight cabinets that may be installed in various stationary and maneuverable platforms.

Further, the telecommunication industry and television and radio broadcast industries are also desirous of a durable protective cabinet which may easily be interchanged and adapted to house components of varying height.

Known to the art are several devices. For example, Oplinger, U.S. Pat. No. 4,202,586, discloses a stackable furniture module with replaceable panels. However, the Oplinger device does not disclose the use of interchangeable uniform height side bar blocks which may be used to create a variable height housing within a modular cabinet. Of some interest is Belu, Union of Soviet Socialist Republic Inventor Certificate No. 577708, which discloses a radio electronic chassis stacking rack for supporting radio components. Belu's device, however, neither provides component protection nor allows for component interchanging or for variable height components.

Also of some interest, and illustrative of the significant differences and improvements found in the instant invention are: Berg, et al., U.S. Pat. No. 3,868,123; Schriefer, U. S. Pat. No. 754,815; Eckert, U.S. Pat. No. 4,022,517; Hurst, Jr., U.S. Pat. No. 4,567,989; Rinkewich, U. Pat. No. 4,432,591; Gordon, U.S. Pat. No. 2,231,005; Levin, U.S. Pat. No. 3,836,043; Norris, U. S. Pat. No. 3,012,762; Weiskopf, U.S. Pat. No. 2,559,203; Albrecht, U.S. Pat. No. 2,589,319; and Lowe, U.S. Pat. No. 4,696,522.

3. Objects of the Invention

Therefore, it is a principal object of the present invention to provide an improved modular storage cabinet for electronic components.

Another object of the present invention is to provide a modular storage cabinet for electronic components which may house components of varying height.

Another object of the present invention is to provide a modular storage cabinet for electronic components which may protectively store one or a plurality of electronic components.

Another object of the present invention is to provide a modular storage cabinet for electronic components which allows components to be added from a compatible storage cabinet without requiring that the electronic component be removed from its related protective modular housing.

Another object of the present invention is to provide a modular storage cabinet for Electronic Industries Association (EIA) standard dimension components.

Another object of the present invention is to provide a modular storage cabinet for electronic components which is economical to manufacture and durable in use.

Another object of the present invention is to provide a modular storage cabinet for electronic components which is efficient in operation and refined in appearance.

Another object of the present invention is to provide a modular storage cabinet for electronic components which is easy to install, simple in construction, and trouble free.

Another object of the present invention is to provide a modular storage cabinet for electronic components that may be adapted to house one or a plurality of drawers.

Another object of the present invention is to provide a modular storage cabinet for electronic components that provides a self contained surge protected alternating current supply plug for each electronic component housed in said cabinet.

Another object of the present invention is to provide a modular storage cabinet for electronic components that provides easy to use multi-center-of-gravity handles.

Another object of the present invention is to provide a modular storage cabinet for electronic components that includes caster means for movably positioning and transporting said cabinet.

Finally, another object of the present invention is to provide a modular storage cabinet for electronic components which is formed of a light-weight and non-conductive material. These and other objects will be apparent to those skilled in the art.

SUMMARY OF THE INVENTION

The present invention provides a modular storage cabinet for electronic components which includes at least one base having front back and opposite side walls. Each base side wall includes a coacting top and bottom fastener. Also provided are any number of a plurality of stackable side bar pairs wherein each side bar includes an elongated wall portion having interior and exterior faces and coacting top and bottom fastening means on each wall portion. The bottom fastening means is adapted to engage the top fastening means of a base or side bar for stackably supporting the side bar in registered relation thereon and the top fastening means being engagable with a bottom fastening means of a base or side bar for stackably supporting the last mentioned base or side bar thereon. Any selected number of side bars may be stacked on each of opposite side walls of a base for defining the space between adjacent stacked bases.

The modular storage cabinet may also include foot means protruding from the lower wall of each side bar and base adapted to be removably received by a shoe cavity whereby any selected number of side bars may be securably stacked on each of opposite side walls of a base for defining the spacing between adjacent stacked bases.

Means for securing the foot means to the described shoe cavity may include a generally oval shaped hole formed through the foot. A pair of generally circular corresponding holes on either side of the shoe cavity (which are in registered relation with the oval shaped hole formed in the foot when the foot is inserted into the shoe cavity) may also be provided. A generally L-shaped pin is also provided having a short linear handle portion and a long slightly cambered portion which is adapted for insertion through the pair of generally circular holes and generally oval shaped hole such that by twisting the pin handle portion the pin removably locks the foot into the shoe cavity.

An electronic component flexible door may also be included for covering the front and/or rear portion of electronic components secured between side bar pairs via a guide track formed in each base unit for slideably accommodating the flexible door.

Caster means may also be provided on the lower most base unit of any modular cabinet configuration in order to facilitate side to side positioning and transporting movements of a cabinet.

Because electronic components often contain heavy devices such as transformers their center of gravity may be far from their dimensional center. A cabinet containing a plurality of such components may be difficult to lift and carry for this reason. Therefore, the present invention includes an elongated recessed handle portion on each side bar which allows the cabinet to be grasped and lifted from any portion along the length of any side bar.

Drawers may also be mounted between side bar pairs for storing miscellaneous equipment. This may be accomplished with drawer mount means which include a door mount track on each side bar and a drawer adapted to be slideably engage between the door mount tracks.

Surge protected alternating current may also be modularly provided to electronic components housed with any configuration of side bar and base configuration by power connection plug means.

BRIEF DESCRIPTION OF THE DRAWINGS

Other objects and advantages of the invention will become apparent upon reading the following detailed description and upon reference to the drawings, in which:

FIG. 4 is an end partial isometric view of three interconnected side bars (with hidden portions indicated with dotted lines for clarity) illustrating the operation of the side bar interlocking cam action clamp;

FIG. 5 is an isometric view of a base (top/mid-range/bottom) unit illustrating the side bar shoes and flexible door locking member;

FIG. 6 is an isometric detail of one of the four symmetrical corners of a base (top/mid-range/bottom) unit taken at section 6⇌6 of FIG. 5;

While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DESCRIPTION OF THE PREFERRED EMBODIMENT

Enterend herein by reference are EIA Standard RS-310-B and Standards Proposal No. 1257, formulated under the cognizance of EIA Working Group P-5.6 on Racks, Panels and Enclosures; and *Owner's Manual Version 1.0: for the Total Height Expansion Rack*, July 1990, ©1990 Modulock Inc., 3960 Laurel Canyon Blvd. (Suite 321), Studio City, Calif. 91604 (818.905.9136).

Figure 1:
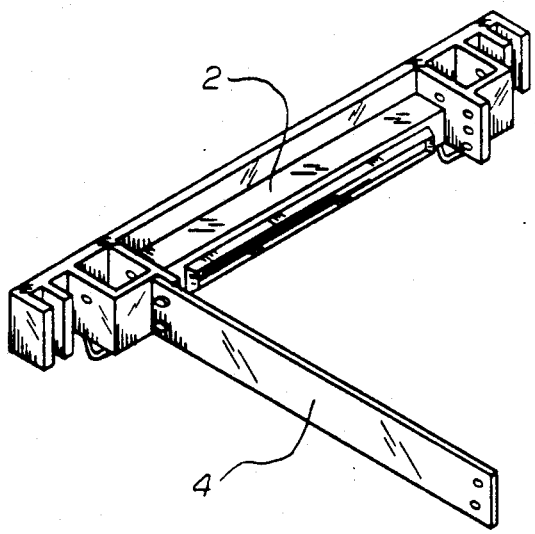
FIG. 1 is an isometric view of the inside of a sample side bar attached to a standard (EIA) 19 inch (48.260 cm) width by 1.75 inch (4.445 cm) height electronic face plate.
Figure 2:
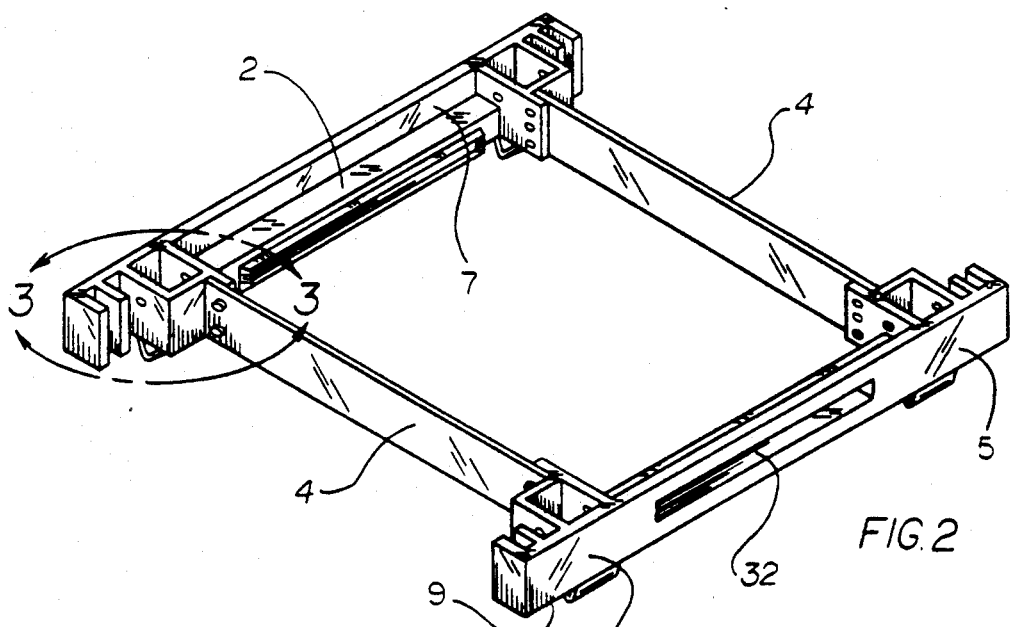
FIG. 2 is an isometric view of the inside of a pair of sample side bars attached to two standard (EIA) 19 inch (48.260 cm) width by 1.75 inch (4.445 cm) height electronic face plates.

A preferred embodiment of the present invention 100 is illustrated in FIGS. 1 through 9. The present invention discloses apparatus for assembling a protective cabinet capable of housing electronic components of varying heights. In a preferred embodiment the device is adapted for use with Electronic Industries Association (EIA) electronic component rack and panel specifications. The present invention consists of two basic modules, namely, at least one base (top/mid-range/bottom) unit 1 (FIG. 5) and at least one pair of side bars 2 (FIG. 1 and 2).

Electronic components manufactured with dimensions complying with EIA standards have face plates 4 which are 19 inches (48.260 cm) wide by units of 1.75 inches (4.445 cm) high. Thus, an EIA standard electronic component is 1 ¾ x inches high (where x is an integer greater than or equal to one ($1 \leq$) and less than or equal to twelve ($12 \geq$), e.g., 1.75, 3.50, 5.25, 7.00, 8.75, ... 21.00).

Figure 3:
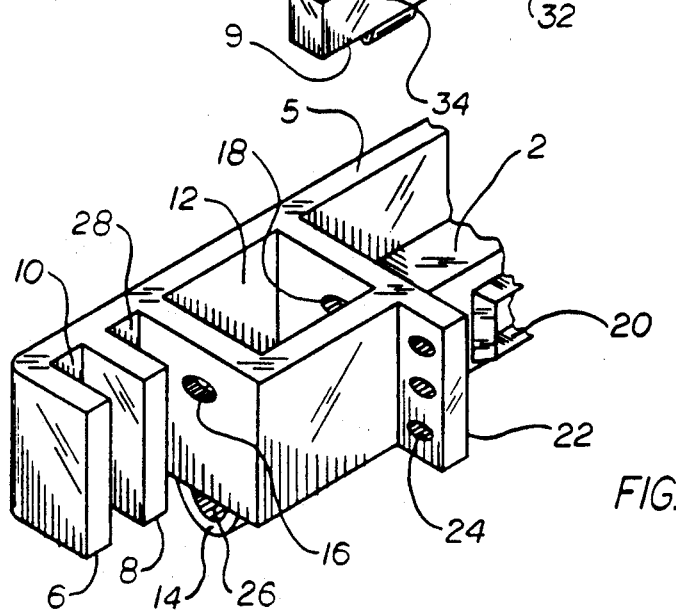
FIG. 3 is an isometric view of a detail (taken at section 3⇌3 of FIG. 2) of one of the symmetrical ends of a side bar.

So that a preferred embodiment of the present invention may accommodate varying height electronic components each side bar 2 has a height equal to 1.75 inches (4.445 cm). Each side bar has an exterior 5 and interior wall 7 and opposing ends. Adjacent each opposing end of each side bar 2 is a face plate mounting bracket 22 having three mounting holes 24 formed therethrough (FIG. 3). These holes are adapted to allow the face plate 4 of any EIA standard electronic component to be secured at either side of a pair of parallel side bars 2 (FIG. 2). Also adjacent each opposing end on the lower wall 9 of each side bar 2 is an attachment foot 14 having a locking pin channel 26 formed therethrough.

On the upper surface at each opposing end of each side bar is an attachment foot receptacle (shoe) 12 adapted to removably receive the attachment foot 14 of another side bar 2 (FIG. 4). At either side of the receptacle (shoe) 12 are a pair of opposing holes (16 and 18; FIG. 3) adapted to accommodate a locking pin 30 (FIG. 4).

In a preferred embodiment each side bar 2 is 26.50 inches (67.31 cm) long, from 0.50 inches (1.27 cm) to 2.125 inches (5.40 cm) wide, and 1.75 inches (4.445 cm) high. Preferably each side bar is injection molded from a suitable non-conductive durable polymer.

Figure 7:
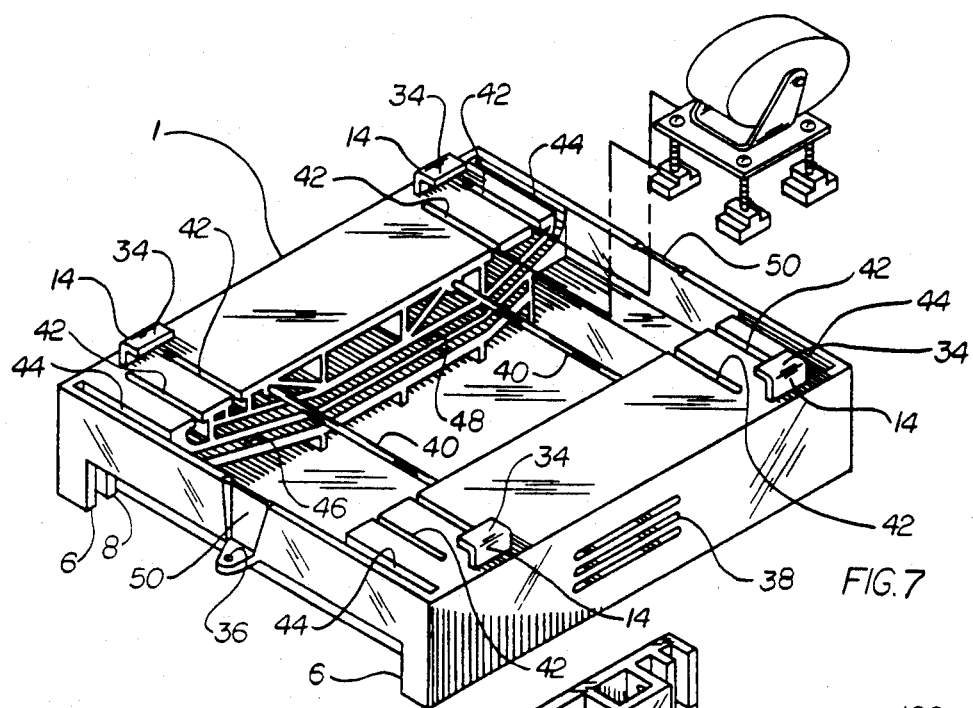
FIG. 7 is an inverted isometric view of the underside of a base (top/mid-range/bottom) unit illustrating the combination caster attachment means and foot securement means.

The remaining main module of the invention is the base (top/mid-range/bottom) unit 1 (FIG. 6 and 7). In a preferred embodiment each base unit 1 has a generally rectilinear upper surface having attachment foot receptacles 12 adjacent each of the surfaces four corners which are adapted to removably receive a pair of side bars 2 (FIG. 5). The lower portion of each base 1 have a combination generally L-shaped caster retention post 34 and attachment foot 14 adjacent each lower portion corner adapted to be removably received by the attachment foot receptacles 12 of side bars 2. The combination generally L-shaped caster retention post 34 and attachment foot 14, in unison with a pair of caster attachment channels 42, is also adapted to removably secure a conventional caster adjacent each corner of each base unit 1 (FIG. 7). Ventilation ports 38 are also provided in the sides of each base unit 1.

Figure 8:
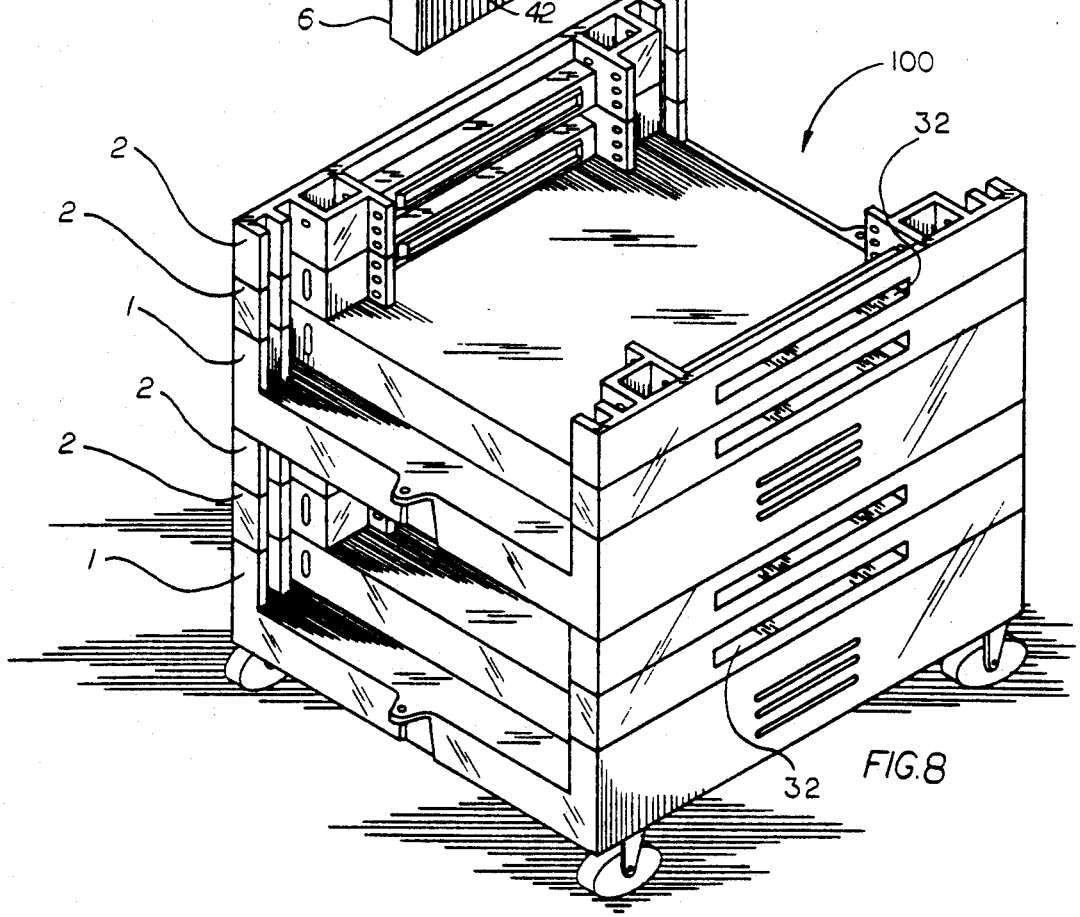
FIG. 8 is a isometric view of a preferred embodiment of the present invention depicting four pairs of side bars interconnected between two base (top/mid-range/bottom) units so as to form two modular housing compartments for supporting and protecting electronic components.

Side bars 2 may be connected to form a side wall of any necessary height between base units 1 such as is illustrated by FIG. 4. As will be apparent from FIGS. 4 and s any number of side bar 2 pairs may be stacked between base units 1. Likewise, any number of modular electronic component housings can be stacked together to form a transportable protective electronic component storage cabinet. For example, it should be apparent to those skilled in the art that two or more cabinets (as shown in FIG. 8) could be stacked to form four or more 3.5 inch (8.89 cm) high modular electronic component housings. Likewise, a lesser or greater number of side bars 2 may be stacked between base units 1 in order to produce a custom electronic component storage cabinet.

As indicated in FIGS. 1, 2, 3, and 4 each side bar 2 includes a drawer slide track 20 (drawer not shown). Adapted to slideably support a drawer for storing necessary goods and accessories. The drawer may be retained at its sides by door guides 10, 28.

Figure 9:
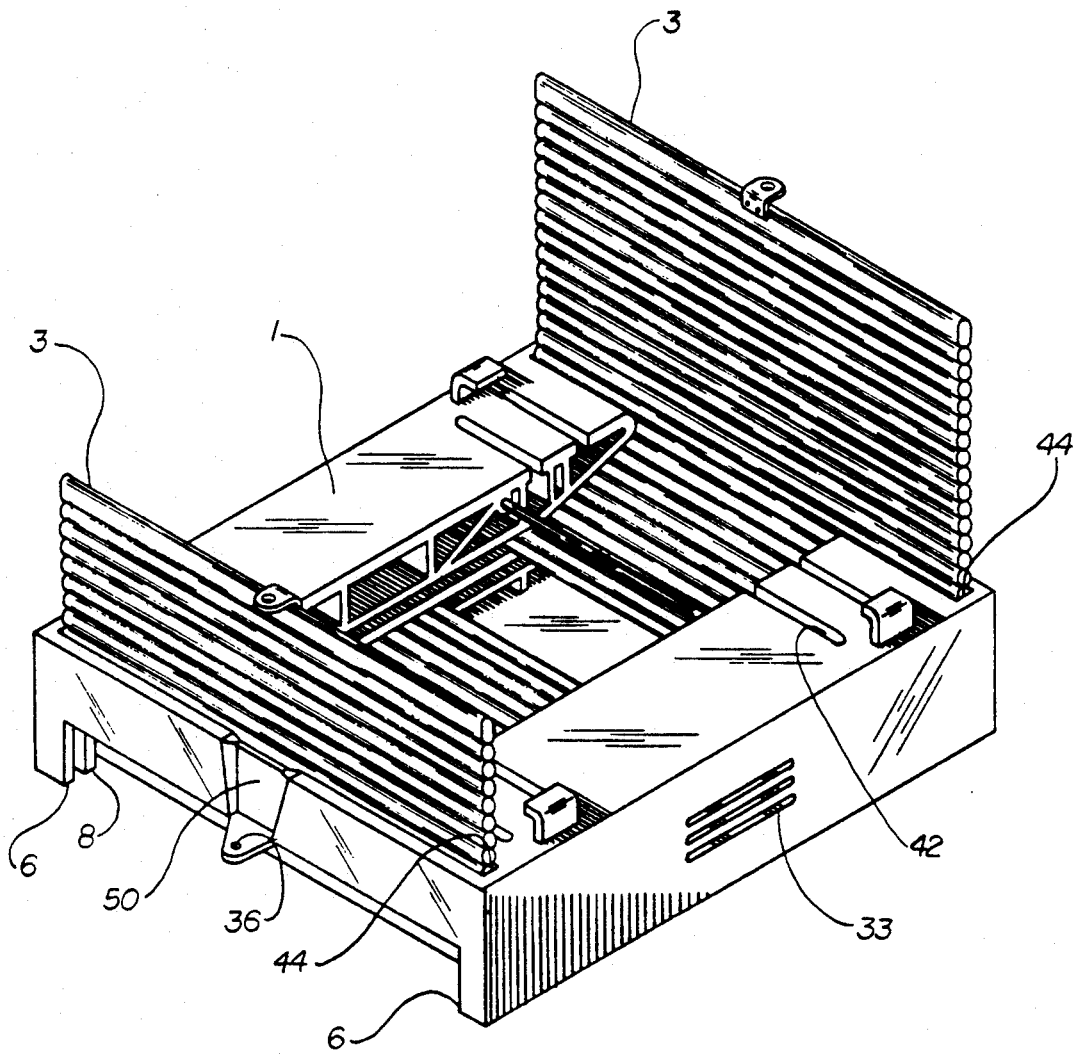
FIG. 9 is an inverted isometric view of the underside of a base (top/mid-range/bottom) unit illustrating the operation of the flexible doors slideably engaged with the upper and lower flexible door storage track.

As best illustrated in FIG. 9 a flexible tambour type door 3 is slideably engaged within flexible door sliding slots 44 (FIG. 7) in base unit 1. The door is housed in a storage track 46 in base unit 1. Such a door 3 is preferably provided so as to cover the front and rear portions of any electronic component housed between any two base units 1. A flexible door latch 50 and latch pin hole 36 are also provided in a preferred embodiment so that each flexible door 4 may be locked in a closed position such that a housed component may be completely protected from the elements.

Illustrated best in FIG. 2 is the multi-center-of-gravity handle 32 formed on each side of each side bar 2. The handle 32 is preferably formed as an elongated cavity adapted for finger grasping at any point along the length of the handle 32.

While the invention has been described with a certain degree of particularity, it is manifest that many changes may be made in the details of construction and the arrangement of components without departing from the spirit and scope of the disclosure. It is understood that the invention is not limited to the embodiment set forth herein for purposes of exemplification, but is to be limited only by the scope of the appended claims including the full range of equivalency to which each element thereof is entitled.

Thus, there has been shown and described an improved modular storage cabinet for electronic components which accomplishes at least all of the stated objects.

We claim:

1. A modular storage cabinet for electronic components, comprising:
   (a) at least two bases having front back and opposite side walls each of said side walls including a coacting top and bottom fastening means;
   (b) a plurality of stackable side bars each side bar including an elongated wall portion having interior and exterior faces, and coacting top and bottom fastening means on said wall portion, said bottom fastening means being engagable with a top fastening means of a base or side bar for stackably supporting said side bar in registered relation thereon and said top fastening means being engagable with a bottom fastening means of a base or side bar for stackably supporting said last mentioned base or side bar thereon;
   (c) any selected number of side bars being stackable on each of opposite side walls of a base for defining the spacing between adjacent stacked bases;
   (d) wherein each of said side bars and bases includes upper and lower walls;
   (e) wherein said coacting top and bottom fastening means comprises:
      (1) foot means protruding from said lower wall of each of said side bars and said bases;
      (2) shoe cavity means from said upper wall of each of said side bars and bases adapted to removably receive foot means from any one of a plurality of said side bars and said bases; and
      (3) means for securing said foot means in said shoe means whereby any selected number of side bars may be secureably stacked on each of opposite side walls of a base for defining the spacing between adjacent stacked bases; and
   (f) wherein said means for securing said foot means in said shoe means comprises:
      (1) a generally oval shaped hole formed through said foot;
      (2) a pair of generally circular holes on either side of said shoe cavity means in registered relation with said oval shaped hole formed in said foot when said foot is inserted into said shoe cavity; and
      (3) a generally L-shaped pin having a short linear handle portion and a long slightly cambered portion, said pin being adapted to be inserted through said pair of generally circular holes and said generally oval shaped hole such that by twisting said handle portion said pin removably locks said foot into said shoe cavity.

2. The modular storage cabinet of claim 1, further comprising a component cover door means.

3. The modular storage cabinet of claim 3, wherein said component cover door means includes a flexible tambour type door.

4. The modular storage cabinet of claim 3, wherein said door means comprises:
- a guide track formed in said base slideably accommodating said flexible tambour type door; and
- door locking means adapted to removably lock said door in a closed position such that components housed in said modular storage cabinet are secured against the elements.

5. The modular storage cabinet of claim 1, wherein said side bars further comprise component securement means for securing at least one side of an electronic component.

6. The modular storage cabinet of claim 5, wherein said component securement means is a mounting face plate.

7. The modular storage cabinet of claim 1, wherein said base further comprises caster means.

8. The modular storage cabinet of claim 7, wherein said caster means comprises means for removably securing at least three casters to said base.

9. The modular storage cabinet of claim 1, wherein said base further comprises a plurality of vent holes formed through said base side walls.

10. The modular storage cabinet of claim 1, wherein said side bars have formed therein an elongated recess which forms a multi-center-of-gravity handle such that a cabinet formed by at least one of said bases and at least a pair of said side bars may be grasped at the center of gravity of said cabinet.

11. The modular storage cabinet of claim 1, further comprising drawer mount means.

12. The modular storage cabinet of claim 11, wherein said drawer mount means comprises a door mount track on each of said sidebar and a drawer adapted to slideably engage said door mount tracks.

* * * * *